(12) United States Patent
Liu et al.

(10) Patent No.: US 9,976,111 B2
(45) Date of Patent: May 22, 2018

(54) TIN HARD MASK AND ETCH RESIDUAL REMOVAL

(71) Applicant: Air Products and Chemicals, Inc., Allentown, PA (US)

(72) Inventors: Wen Dar Liu, Chupei (TW); Yi-Chia Lee, Chupei (TW); William Jack Casteel, Jr., Fountain Hill, PA (US); Tianniu Chen, Westford, MA (US); Rajiv Krishan Agarwal, Malvern, PA (US); Madhukar Bhaskara Rao, Carlsbad, CA (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 84 days.

(21) Appl. No.: 15/138,835

(22) Filed: Apr. 26, 2016

(65) Prior Publication Data

US 2017/0107460 A1 Apr. 20, 2017

Related U.S. Application Data

(60) Provisional application No. 62/155,794, filed on May 1, 2015, provisional application No. 62/164,293, filed
(Continued)

(51) Int. Cl.

| | |
|---|---|
| *C11D 7/26* | (2006.01) |
| *C11D 11/00* | (2006.01) |
| *C11D 3/39* | (2006.01) |
| *C11D 3/43* | (2006.01) |
| *C11D 3/30* | (2006.01) |
| *C11D 3/20* | (2006.01) |

(Continued)

(52) U.S. Cl.
CPC ........ *C11D 11/0047* (2013.01); *C11D 3/0073* (2013.01); *C11D 3/2086* (2013.01); *C11D 3/28* (2013.01); *C11D 3/30* (2013.01); *C11D 3/33* (2013.01); *C11D 3/3773* (2013.01); *C11D 3/3947* (2013.01); *C11D 3/43* (2013.01); *H01L 21/02068* (2013.01); *H01L 21/0332* (2013.01); *H01L 21/31111* (2013.01); *H01L 21/76865* (2013.01)

(58) Field of Classification Search
CPC .............................. C11D 7/50; C11D 11/0047
USPC .................................................. 510/175, 176
See application file for complete search history.

(56) References Cited

U.S. PATENT DOCUMENTS

| | | |
|---|---|---|
| 7,922,824 B2 | 4/2011 | Minsek et al. |
| 7,928,046 B2 | 4/2011 | Ilardi et al. |

(Continued)

FOREIGN PATENT DOCUMENTS

| | | |
|---|---|---|
| JP | 2014093407 A2 | 5/2014 |
| WO | 0233033 A1 | 4/2002 |

(Continued)

*Primary Examiner* — Gregory Webb
(74) *Attorney, Agent, or Firm* — Lina Yang

(57) ABSTRACT

Composition, method and system for PVD TiN hard mask removal from 28/20 nm pattern wafers have been disclosed. The composition uses peroxide as oxidizing agent for PVD TiN hard mask removal under slightly basic conditions. The composition comprises bulky or long chain organic amines or polyalkylamine to improve removal/etching selectivity of PVD TiN vs CVD TiN. The composition further comprises long chain organic acids or amines to maintain Co compatibility.

30 Claims, 6 Drawing Sheets

Related U.S. Application Data on May 20, 2015, provisional application No. 62/281,658, filed on Jan. 21, 2016.

(51) Int. Cl.

| | | |
|---|---|---|
| *C11D 3/33* | (2006.01) | |
| *C11D 3/28* | (2006.01) | |
| *C11D 3/00* | (2006.01) | |
| *C11D 3/37* | (2006.01) | |
| *H01L 21/311* | (2006.01) | |
| *H01L 21/033* | (2006.01) | |
| *H01L 21/768* | (2006.01) | |
| *H01L 21/02* | (2006.01) | |

(56) References Cited

U.S. PATENT DOCUMENTS

| | | | |
|---|---|---|---|
| 2002/0077259 A1* | 6/2002 | Skee | C11D 3/0073 510/175 |
| 2006/0226122 A1 | 10/2006 | Wojtczak | |
| 2009/0131295 A1 | 5/2009 | Cui | |
| 2011/0147341 A1 | 6/2011 | Sato et al. | |
| 2012/0058644 A1 | 3/2012 | Klipp | |
| 2013/0045908 A1 | 2/2013 | Cui | |
| 2013/0101907 A1 | 4/2013 | Takahashi et al. | |
| 2013/0157472 A1 | 6/2013 | Cui | |
| 2016/0032186 A1 | 2/2016 | Chen et al. | |
| 2016/0130500 A1 | 5/2016 | Chen et al. | |
| 2016/0186058 A1* | 6/2016 | Parris | C09K 13/02 216/18 |
| 2016/0200975 A1 | 7/2016 | Cooper et al. | |

FOREIGN PATENT DOCUMENTS

| | | |
|---|---|---|
| WO | 2006110279 A1 | 10/2006 |
| WO | 2013101907 A1 | 7/2013 |
| WO | 2015053800 A2 | 4/2015 |
| WO | 2015054460 A1 | 4/2015 |
| WO | 2015054464 A1 | 4/2015 |

\* cited by examiner

TIN HARD MASK AND ETCH RESIDUAL REMOVAL

CROSS-REFERENCE TO RELATED APPLICATIONS

This application claims the benefit of priority under 35 U.S.C. § 119(e) to earlier filed U.S. patent application Ser. No. 62/155,794 filed on May 1, 2015, to earlier filed U.S. patent application Ser. No. 62/164,293 filed on May 20, 2015, and to earlier filed U.S. patent application Ser. No. 62/281,658 filed on Jan. 21, 2016, the disclosures of which are incorporated herein by reference.

BACKGROUND

As scaling continues to ever smaller feature sizes, integrated circuit (IC) reliability is an increasing concern in IC fabrication technology. The impact of trace interconnect failure mechanisms on device performance and reliability demand much more from integration schemes, interconnect materials, and processes. An optimal low-k dielectric material and its related deposition, pattern lithography, etching and cleaning are required to form dual-damascene interconnect patterns. A hard-mask scheme approach of interconnects-patterning wafer fabrication is the ability to transfer patterns into under layers with tightest optimal dimension control.

As technology nodes advance to nanotechnology, metal hard-mask materials such as TIN are used to gain better etching/removal selectivity, better pattern retention and profile control to the low-k materials during the pattern etching process.

Compositions have been developed to pullback or remove these types of metal hard-masks from substrates. The following patents are representative.

US 2006/0226122 discloses a wet etching composition including hydrogen peroxide; an organic onium hydroxide; and an acid. In another embodiment, the invention relates to a method of wet etching metal nitride selectively to surrounding structures comprising one or more of silicon, silicon oxides, glass, PSG, BPSG, BSG, silicon oxynitride, silicon nitride and silicon oxycarbide and combinations and mixtures thereof and/or photoresist materials, including steps of providing a wet etching composition including hydrogen peroxide, an organic onium hydroxide, and an organic acid; and exposing a metal nitride to be etched with the wet etching composition for a time and at a temperature effective to etch the metal nitride selectively to the surrounding structures.

US 2011/0147341 discloses an etching solution for titanium-based metals, tungsten-based metals, titanium/tungsten-based metals or their nitrides. The etching solution contains 10-40 mass % hydrogen peroxide, 0.1-15 mass % of an organic acid salt, and water.

U.S. Pat. No. 7,922,824 discloses an oxidizing aqueous cleaning composition and process for cleaning post-plasma etch residue and/or hardmask material from a microelectronic device having said residue thereon. The oxidizing aqueous cleaning composition includes at least one oxidizing agent, at least one oxidizing agent stabilizer comprising an amine species selected from the group consisting of primary amines, secondary amines, tertiary amines and amine-N-oxides, optionally at least one co-solvent, optionally at least one metal-chelating agent, optionally at least one buffering species, and water. The composition achieves highly efficacious cleaning of the residue material from the microelectronic device while simultaneously not damaging the interlevel dielectric and metal interconnect material also present thereon.

U.S. Pat. No. 7,928,046 discloses an aqueous, silicate free, cleaning compositions of about pH 9 or below and method of using the cleaning compositions for cleaning microelectronic substrates, which compositions are able to essentially completely clean such substrates and produce essentially no metal corrosion of the metal elements of such substrates. The aqueous cleaning compositions of present invention have (a) water, (b) at least one of ammonium and quaternary ammonium ions and (c) at least one of hypophosphite ($H_2PO_2^-$) and/or phosphite ($HPO_3^{2-}$) ions. The cleaning compositions also may contain fluoride ions. Optionally, the composition may contain other components such as organic solvents, oxidizing agent, surfactants, corrosion inhibitors and metal complexing agents.

US 2013/0045908 discloses a semiconductor processing composition and method for removing photoresist, polymeric materials, etching residues and copper oxide from a substrate comprising copper, low-k dielectric material and TiN, TiNxOy or W wherein the composition includes water, a Cu corrosion inhibitor, at least one halide anion selected from $Cl^-$ or $Br^-$, and, where the metal hard mask comprises TiN or TiNxOy, at least one hydroxide source.

WO 2013/101907 A1 discloses compositions comprising etchants including hexafluorosilicic acid and hexafluorotitanate, at least one oxidant including high valent metals, peroxide or high oxidation state species and at least one solvent.

US 2013/0157472 discloses a semiconductor processing composition and method for removing photoresist, polymeric materials, etching residues and copper oxide from a substrate comprising copper, low-k dielectric material and TIN, TiNxOy or W wherein the composition includes water, at least one halide anion selected from $Cl^-$ or $Br^-$, and, where the metal hard mask comprises only TiN or TiNxOy, optionally at least one hydroxide source.

US 2012/0058644 A1 (BASF) discloses a liquid composition free from N-alkylpyrrolidones and hydroxyl amine and its derivatives, having a dynamic shear viscosity at 50° C. of from 1 to 10 mPas as measured by rotational viscometry and comprising based on the complete weight of the composition, (A) of from 40 to 99.95% by weight of a polar organic solvent exhibiting in the presence of dissolved tetramethylammonium hydroxide (B) a constant removal rate at 50° C. for a 30 nm thick polymeric barrier anti-reflective layer containing deep UV absorbing chromophoric groups, (B) offrom 0.05 to <0.5% of a quaternary anunonium hydroxide, and (C)<5% by weight of water; method for its preparation, a method for manufacturing electrical devices and its use for removing negative-tone and positive-tone photoresists and post etch residues in the manufacture of DD Stacked Integrated Circuits and 3D Wafer Level Packagings by way of patterning Through Silicon Vias and/or by plating and bumping.

US 2009/0131295 A1 discloses compositions for removing and cleaning resist, etching residues, planarization residues, metal fluorides and/or metal oxides from a substrate are provided, the composition including a metal ion-free fluoride compound and water. The resist, etching residues, planarization residues, metal fluorides and/or metal oxides are generated during one or more patterning processes during which a metal hard mask is used.

Compositions based on peroxides for TiN removal have been described in the prior art. These have incorporated alcoholamine bases in aqueous solvent systems and solventrich systems. A key problem of previous compositions has been the instability of the compositions once peroxide is added. This appears to be due to the use of oxidizable components in the composition which lead to the decomposition of hydrogen peroxide in the composition and its de-activation. This inherent instability has necessitated expensive point of use mixing of the peroxide with the remaining components of the composition and has limited the ability to use the prior art chemistries in a recycle-mode.

In addition to its use as hard mask material, TiN is also often used as a metallic adhesion or liner layer for metal plugs at the MO level. While PVD TiN is used for forming a hard mask over large regions of the wafer prior to plasma etching, PVD deposition methodology does not readily provide the kind of conformal deposition required for depositing the liner prior to deposition of the high aspect ratio metal plugs. Chemical Vapor Deposition (CVD) is ideally suited to deposit such conformal coatings, and is typically used for forming the TiN adhesion layer. Ideally a wet chemistry designed for removing the TiN hard mask after the plasma etching process, should not etch the TiN liner. Depending on the type of metal plug, this can pose a difficult challenge, because the hardmask and adhesion layer TiN are often very similar in chemical composition.

Compositions of the prior art show no selectivity for etching of PVD TiN used in a hard mask vs. etching of CVD TiN used in a metal liner or adhesion layer. In those compositions high TiN hard mask removal will also likely coincide with some liner/adhesion layer loss. Accordingly, there is a need in the art for a stripper composition that does not suffer from the above-mentioned drawbacks.

SUMMARY

The present invention provides a composition, system and process for selectively removing/etching hard mask layers and etch residues relative to metal conductor layers and low-k, dielectric layers that are present. More specifically, the present invention relates to a composition, system and process for selectively removing/etching a PVD titanium nitride hard mask and/or etch residues relative to copper (Cu), cobalt (Co), CVD titanium nitride used in a metal liner or adhesion layer, dielectric material such as TEOS, PETEOS, and low-k dielectric layers.

In one aspect, a composition for selectively removing/etching PVD titanium nitride (TiN or TiNxOy; where x=0 to 1.3 and y=0 to 2) from a semiconductor device comprising the PVD titanium nitride and a second material selected from the group consisting of Cu, Co, CVD titanium nitride, dielectric material, low-k dielectric material, and combinations thereof, the composition comprising:
  1 to 20 wt % peroxide,
  1-5 wt % base,
  0.1-1 wt % weak acid,
  0.5 to 2 wt % ammonium salt,
  25 to 5000 ppm corrosion inhibitor or 1-15 wt % of a long chain or mixed alkylammonium hydroxide,
  10 to 5000 ppm long chain organic amine or polyalkylamine, and
  the remainder is solvent;
wherein the composition has a pH ranging from 7 to 11.5, preferably 8 to 10.5, more preferably 8.5 to 9.5; and the composition offers a removal/etch selectivity of PVD titanium nitride vs. CVD titanium nitride>2 when the second material is CVD titanium nitride.

In another aspect, a system for selectively removing/etching PVD titanium nitride (TiN or TiNxOy, where x=0 to 1.3 and y=0 to 2) from a surface of a microelectronic device, comprising:
the semiconductor device comprising the PVD titanium nitride and a second material selected from Cu Co, CVD titanium nitride, dielectric material, low-k dielectric material and combinations thereof,
a composition for selectively removing the titanium nitride from the semiconductor device comprising:
  1 to 20 wt % peroxide,
  1-5 wt % base,
  0.1-1 wt % weak acid,
  0.5 to 2 wt % ammonium salt,
  25 to 5000 ppm corrosion inhibitor or 1-15 wt % of a long chain or mixed alkylammonium hydroxide,
  10 to 5000 ppm long chain organic amine or polyalkylamine, and
  the remainder is solvent;
wherein the composition has a pH ranging from 7 to 11.5, preferably 8 to 10.5, more preferably 8.5 to 9.5; and the PVD titanium nitride and the second material are in direct contact with the composition.

In yet another aspect, a process of selectively removing/etching PVD titanium nitride (TiN or TiNxOy, where x=0 to 1.3 and y=0 to 2) comprising:
providing a semiconductor device comprising the PVD titanium nitride and a second material selected from Cu, Co, CVD titanium nitride, dielectric material, low-k dielectric material;
contacting the semiconductor device with a composition comprising:
  1 to 20 wt % peroxide,
  1-5 wt % base,
  0.1-1 wt % weak acid,
  0.5 to 2 wt % ammonium salt,
  25 to 5000 ppm corrosion inhibitor or 1-15 wt % of a long chain or mixed alkylammonium hydroxide,
  10 to 5000 ppm long chain organic amine or polyalkylamine and/or long chain organic acid, and
  the remainder is solvent;
  wherein the composition has a pH ranging from 7 to 11.5, preferably 8 to 10.5, more preferably 8.5 to 9.5; and
selectively removing the PVD titanium nitride;
wherein the PVD titanium nitride and the second material are in direct contact with the composition and removal selectivity of the PVD titanium nitride vs. CVD titanium nitride is >2 when the second material is CVD titanium nitride.

The peroxide to be used in the composition may include but is not limited to hydrogen peroxide, ammonium persulfate, peracidic acid, peroxybenzoic acid, and combinations thereof. The peroxide may be used at a concentration of 1 to 20 wt % in the composition, preferably 3-15 wt %, more preferably 6-9 wt %.

The bases to be used in the composition may include but are not limited to tetraethylammonium hydroxide (TEAH), trimethylphenylammonium hydroxide (TMPAH), tetramethylammonium hydroxide, tetrabutylammonium hydroxide, choline hydroxide, ammonium hydroxide, and combinations thereof. The bases may be used at a concentration of from 1-5 wt %, preferably 2-4 wt %, more preferably 2-3 wt %.

The weak acids to be used in the composition may include, but are not limited to carboxylic acids including citric acid, oxalic acid, malonic acid, lactic acid, adipic acid, acetic acid, iminodiacetic acid, and combinations thereof. The weak acids may be used at a concentration of 0.1 to 1 wt %, preferably 0.2 to 0.8 wt %, more preferably 0.4 to 0.6 wt %.

The ammonium salt to be used in the composition may include, but are not limited to ammonium salts of weak bases and include ammonium citrate, ammonium acetate, ammonium malonate, ammonium adipate, ammonium lactate, ammonium iminodiacetate, ammonium chloride, ammonium bromide, ammonium fluoride, ammonium bifluoride, ammonium sulfate, and combinations thereof. The ammonium salt buffer may be used at a concentration of 0.5 to 2 wt %, preferably 0.75 to 1.5 wt %, more preferably 1 to 1.5 wt %.

The corrosion inhibitors to be used in the composition include, but are not limited to 1,2,4-triazole, benzotriazole, methyl-1H-benzotriazole, 2-aminobenthothiazole, benzimidazole, 2-mercapto-5-methylbenzimidaole, 8-hydroxyquinoline, 1-thioglycerol, ascorbic acid, pyrazole, and combinations thereof. The corrosion inhibitor may be used at a concentration of 25 to 5000 ppm, preferably 100 to 3000 ppm, more preferably 1000 to 3000 ppm.

The long chain or mixed alkylammonium hydroxide to be used in the composition includes, but is not limited to trimethylphenylammonium hydroxide (TMPAH), choline hydroxide, tetrabutylammonium hydroxide and mixed tetraalkylammonium hydroxide, wherein the alkylammonium cation contains alkyl groups of at least two different chain lengths.

The concentration of the non-corrosion inhibitor type of chemical additives ranges from 1 to 15 wt %, preferably 1 to 10 wt %, more preferably 1 to 5 wt %.

The compositions may comprise bulky or long chain organic acids, amines or polyalkylamines to improve Co compatibility of the compositions.

The long chain organic amines or polyalkylamines include but are not limited to long chain organic amines, such as hexylamine, surfactant salts of hexylamine, octylamine, surfactant salts of octylamine, decylamine, surfactant salts of decylamine, dodecylamine, surfactant salts of dodecylamine, dicyclohexylamine, surfactant salts of dicyclohexylamine; polyethyleneimine (PEI) with molecular weight (MW) from 600 to 1000,000, surfactant salts of polyethyleneimine, and combinations thereof.

The bulky or long chain organic amines may be used at a concentration of from 10 to 5000 ppm, preferably 25 to 3500 ppm, more preferably 50 to 2500 ppm.

The compositions may be fully aqueous, i.e., the solvent is water; or additional non-aqueous solvents may be added. The water may be deionized water (DI water), purified water, or distilled water.

The non-aqueous solvents to be used in the composition may include, but are not limited to dimethylsulfide (DMS), dimethyl sulfoxide (DMSO), dimethyl sulfone ($DMSO_2$), sulfolane (($CH_2$)$_4SO_2$), n-methylpyrrolidone, dipropyleneglycolmethylether, tripropyleneglycolmethyl ether, and combinations thereof.

The non-aqueous solvents may be used at a concentration of ranging from 0 to 50 wt %, preferably 0 to 30 wt %, more preferably 0 to 20 wt %.

The compositions may comprise a chelating agent including, but are not limited to glycine, iminodiacetic acid, nitrilotriacetic acid, glutamic acid, picolinic acid, ethylenediamine tetraacetic acid (EDTA), and combinations thereof. The chelating agent may be used at a concentration of from 0.01 to 1 wt %, preferably 0.1 to 1 wt %, more preferably 0.1 to 0.6 wt %.

The compositions may comprise radical inhibitors to prevent decomposition of the oxidizer by trace metals. In the case where hydrogen peroxide is the oxidant, the radical scavengers is used to prevent the formation of hydroxyl and peroxide radicals typically generated by trace metal cations leading to formation of oxygen and water.

The compositions may comprise radical scavengers including, but are not limited to manitol, polyalkylamines, (2,2,6,6-Tetramethylpiperidin-1-yl)oxyl(TEMPO), diphenylamines, and combinations thereof. The radical scavenger may be used at a concentrations ranging from 100 ppm to 1000 ppm, preferably 100-500 ppm, more preferably 100-250 ppm.

The compositions may comprise bulky or long chain organic acids or amines to improve Co compatibility of the compositions. Examples of long chain organic acids include, but are not limited to decanonic acid, dodecanoic acid, dimer acid; and examples for long chain amines including hexylamine, surfactant salts of hexylamine, octylamine, surfactant salts of octylamine, dicyclohexylamine, surfactant salts of dicyclohexylamine, decylamine, surfactant salts of decylamine, dodecylamine, surfactant salts of dodecylamine, and combinations thereof. The bulky or long chain organic acids or amines may be used at a concentration of from 10 to 5000 ppm, preferably 25 to 3500 ppm, more preferably 50 to 2500 ppm.

DETAILED DESCRIPTION

Figure 1:
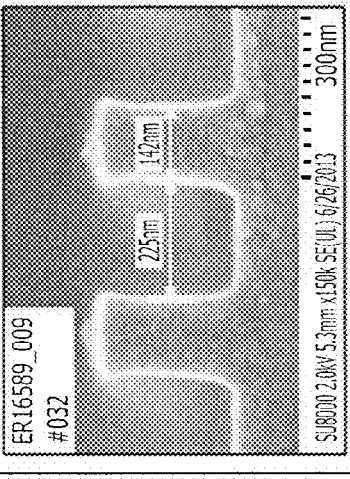
FIG. 1 includes micrographs showing trench damage after cleaning a PDEMs 2.2 patterned wafer.

The ensuing detailed description provides preferred exemplary embodiments only, and is not intended to limit the scope, applicability, or configuration of the invention. Rather, the ensuing detailed description of the preferred exemplary embodiments will provide those skilled in the art with an enabling description for implementing the preferred exemplary embodiments of the invention. Various changes may be made in the function and arrangement of elements without departing from the spirit and scope of the invention, as set forth in the appended claims.

In the claims, letters may be used to identify claimed method steps (e.g., a, b, and c). These letters are used to aid in referring to the method steps and are not intended to indicate the order in which claimed steps are performed, unless and only to the extent that such order is specifically recited in the claims.

The present development discloses a cleaning composition of chemical strippers for PVD TiN hard mask removal or etching ("removal" and "etching" are interchangeable as used in the present disclosure) on 28 nm wafers and beyond. A PVD TIN hard mask is used as a hard mask to provide fine feature control during plasma etching at the 28 nm technology node and smaller. Suitable stripper/cleaning chemistries must be able to pullback or totally remove the PVD TiN hard mask as well as any residues from the plasma etch process. However, the chemistries have to provide compatibility for the CVD TIN used as the liner or adhesion layer for the metal plugs.

The cleaning compositions of the present invention comprise a peroxide, a base, a weak acid, an ammonium salt, a corrosion inhibitor or a non-corrosion inhibitor type of chemical additive to prevent copper loss, long chain organic amine or polyalkylamine, and the rest is substantially solvent.

The cleaning compositions employ a peroxide such as, for example, hydrogen peroxide, as an oxidizing agent for TiN hard mask removal with a base, a weak acid and an ammonium salt buffer system formed between a base and weak acid to maintain the pH of the cleaning composition at >7, preferably between 7 and 10.5, more preferably between 8 and 10, and most preferably between 8.5 and 9.5.

The cleaning composition may employ a corrosion inhibitor to minimize copper loss from the composition and a chelating agent to improve stability of the composition.

While the compositions can be fully aqueous, an alternative embodiment uses solvents to enhance TIN etch performance or improve selectivity. Another embodiment employs a radical inhibitor to improve composition stability.

The peroxide to be used in the composition may include but is not limited to hydrogen peroxide, ammonium persulfate, peracidic acid, peroxybenzoic acid, and combinations thereof.

The peroxide may be employed at a concentration of 1 to 20 wt % in the composition, preferably 3 to 15 wt %, more preferably 6 to 9 wt %. In other embodiments, the peroxide may be employed at a concentration of 1 to 9 wt % in the composition and, preferably, from 3 to 9 wt %. In still other embodiments, the concentration of peroxide is from 3 wt % to 15 wt % and preferably 15 wt %.

The base to be used in the composition may include but are not limited to tetraethylammonium hydroxide(TEAH), trimethylphenylammonium hydroxide(TMPAH), tetramethylammonium hydroxide, tetrabutylammonium hydroxide, choline hydroxide, ammonium hydroxide, and combinations thereof.

The base may be employed at a concentration of from 1 to 5 wt %, preferably 2 to 4 wt %, more preferably 2 to 3 wt %.

The weak acid to be employed in the composition may include, but are not limited to carboxylic acids including citric acid, oxalic acid, malonic acid, lactic acid, adipic acid, acetic acid, iminodiacetic acid, and combinations thereof.

The acid may be employed at a concentration of 0.1 to 1 wt %, preferably 0.2 to 0.8 wt %, more preferably 0.4 to 0.6 wt %.

The ammonium salt to be employed in the composition may include, but are not limited to ammonium salts of weak bases and include ammonium citrate, ammonium acetate, ammonium malonate, ammonium adipate, ammonium lactate, ammonium iminodiacetate, ammonium chloride, ammonium bromide, ammonium fluoride, ammonium bifluoride, ammonium sulfate, and combinations thereof.

The ammonium salt buffer may be employed at a concentration of 0.5 to 2 wt %, preferably 0.75 to 1.5 wt %, more preferably 1 to 1.5 wt %.

The buffer salt may be added as the compound mentioned or through combination of ammonium hydroxide and conjugate acids of the salts mentioned.

The compositions include a corrosion inhibitor or a non-corrosion inhibitor type of chemical additive to prevent copper loss.

The corrosion inhibitors to be used in the composition include, but are not limited to 1,2,4-triazole, benzotriazole, methyl-1H-benzotriazole, 2-aminobenthothiazole, benzimidazole, 2-mercapto-5-methylbenzimidaole, 8-hydroxyquinoline, 1-thioglycerol, ascorbic acid, pyrazole, and combinations thereof.

The corrosion inhibitor may be used at a concentration of 25 to 5000 ppm, preferably 100 to 3000 ppm, more preferably 1000 to 3000 ppm.

The long chain or mixed alkylammonium hydroxide includes, but is not limited to trimethylphenylammonium hydroxide (TMPAH), choline hydroxide, tetrabutylammonium hydroxide and mixed tetraalkylammonium hydroxide, wherein the alkylammonium cation contains alkyl groups of at least two different chain lengths.

The concentration of the long chain or mixed alkylammonium hydroxide ranges from 1 to 15 wt %, preferably 1 to 10 wt %, more preferably 1 to 5 wt %.

The compositions comprise additives to improve the removal/etch selectivity between PVD TIN used to fabricate the hard mask and CVD TiN used as the liner or adhesion layer for the metal plugs.

The removal/etch selectivity for PVD TiN vs. CVD TiN is defined as the ratio of the etch rate (or removal rate) for PVD TiN vs. the etch rate (or removal rate) for CVD TiN:

$$\frac{\text{Etch Rate for } PVD\ TiN}{\text{Etch Rate for } CVC\ TiN}.$$

The additives include but are not limited to long chain organic amines or polyalkylamines. The long chain organic amines or polyalkylamines include but are not limited to hexylamine, surfactant salts of hexylamine, octylamine, surfactant salts of octylamine, dicyclohexylamine, surfactant salts of dicyclohexylamine, polyethyleneimine (PEI), surfactant salts of polyethyleneimine, decylamine, surfactant salts of decylamine, dodecylamine, surfactant salts of dodecylamine, and combinations thereof.

The additives may be used at a concentration of from 10 to 5000 ppm, preferably 25 to 3500 ppm, more preferably 50 to 2500 ppm.

Without intending to be bound by theory, these compounds are believed to bind more strongly to the CVD TiN crystal morphology than the PVD TiN crystal morphology, thereby suppressing etching of the CVD TiN more than the PVD TIN.

The compositions of the present invention may also include a metal chelating agent. The metal chelating agent complexes trace metals which may accumulate in the composition during re-cycled use of the composition and prevent them from decomposing the oxidizer of the composition.

Free trace metal cations, in particular copper ions, catalyze the disprotionation of hydrogen peroxide into oxygen and water which will accelerate the reduction of etching and cleaning performance of the composition over time.

The chelating agents to be used in the composition may include, but are not limited to glycine, iminodiacetic acid, nitrilotriacetic acid, glutamic acid, picolinic acid, ethylenediamine tetraacetic acid (EDTA), and combinations thereof. More biodegradable chelators of this invention are Ethylenediamine-N,N'-disuccinic acid (EDDS) and Cyclohexanediaminetetraacetic Acid (CDTA).

The chelating agent may be used at a concentration of from 0.01 to 1 wt %, preferably 0.1 to 1 wt %, more preferably 0.1 to 0.6 wt %.

The compositions may also include an additive(s) to improve Co compatibility. Such additives include, but are not limited to, bulky or long chain organic acids or amines.

Examples of long chain organic acids include, but are not limited to decanonic acid, dodecanoic acid, dimer acid; and examples for long chain amines including hexylamine, surfactant salts of hexylamine, octylamine, surfactant salts of octylamine, dicyclohexylamine, surfactant salts of dicyclohexylamine, decylamine, surfactant salts of decylamine, dodecylamine, surfactant salts of dodecylamine, and combinations thereof. Examples of surfactant salts of the amines include but are not limited to ammonium salts of the amines.

The bulky or long chain organic acids or amines may be used at a concentration of from 10 to 5000 ppm, preferably 25 to 3500 ppm, more preferably 50 to 2500 ppm.

In another embodiment, the compositions of present invention may include radical scavengers or radical inhibitors to prevent decomposition of the oxidizer by trace metals. In the case where hydrogen peroxide is the oxidant, the radical scavengers is used to prevent the formation of hydroxyl and peroxide radicals typically generated by trace metal cations leading to formation of oxygen and water.

The radical scavengers to be used in the composition may include, but are not limited to, manitol, polyalkylamines, (2,2,6,6-Tetramethylpiperidin-1-yl)oxyl (TEMPO), diphenylamines, and combinations thereof.

The radical scavenger may be used at a concentrations ranging from 100 ppm to 1000 ppm, preferably 100 to 500 ppm, and more preferably 100 to 250 ppm.

The compositions of present invention may be fully aqueous, i.e., the solvent is water; or additional non-aqueous solvents may be added. The water may be deionized water (DI water), purified water, or distilled water.

The non-aqueous solvents to be used in the composition may include, but are not limited to dimethyl sulfoxide (DMSO), dimethyl sulfone ($DMSO_2$), sulfolane (($CH_2)_4 SO_2$), n-methylpyrrolidone, dipropyleneglycolmethylether, tripropyleneglycolmethyl ether, and combinations thereof.

The non-aqueous solvents may be used at a concentration of ranging from 0 to 50 wt %, preferably 0 to 30 wt %, more preferably 0 to 20 wt %.

The high pH, hydrogen peroxide compositions described in this invention, are developed based on blanket and patterned wafer studies. In this platform, there are some distinct features:
1. High rates of PVD TiN etch are observed at moderate temperatures ranging from 35 to 55° C. Plasma etch residues are readily removed from patterned wafers.
2. Cu etch rate is suppressed by adding a novel corrosion inhibitor, such as methyl-benzotriazole/TTL. Alternatively, Cu etch rate may be suppressed by the use of a novel non-corrosion inhibitor type of chemical additive such as the bulky trimethylphenyl ammonium hydroxide.
3. Etch Selectivity of PVD TiN used for the hard mask over CVD TiN used for the liner or adhesion layer can be significantly improved using bulky organic amines, such as octylamine or polyethyleneimine.
4. Co etch rate can be further suppressed by adding long chain organic acids or amines, such as decanonic acid.

EXAMPLES

The following examples are provided for the purpose of further illustrating the present invention but are in no way to be taken as limiting. Unless otherwise noted, all compounding amounts are expressed by weight percent (wt %).

The etch rates were measured at room temperature to 55° C., the time frame for etching PVD TiN, CVD TIN and Co were 0 to 2 minutes, 0 to 0.5 minutes, and 0 to 10 minutes, respectively. The etch rates were measured using a ResMap 4 point probe resistivity meter. The etch rates were calculated by the thickness difference before and after treatment divided by immersion time.

PVD and CVD TiN may be acquired from a number of vendors including Silicon Valley Microelectronics (Santa Clara, Calif.).

Example 1: Composition Preparation

The specific amount of citric acid and triammonium citrate were weighed and dissolved by DI water in a beaker to obtain a citric buffer solution. TEAH (35%) was added in the citric buffer solution slowly. Methyl-1H-benzotriazole was then added in the solution, along with EDTA and PEI solution. If sulfolane was added, it could be added at this point. The solution was stirred to dissolve methyl-1H-benzotriazole; and EDTA. Octylamine could be added to the solution at this point either neat or as the octylammonium citrate salt dissolved in water. $H_2O_2$ was added in the solution. The solution was mixed homogeneously. All steps were performed at room temperature.

Example 2: Additives to Improve Etch Selectivity for PVD TiN vs. CVD TiN

Compositions E21334-136I, E61412-106Q, E61412-106R, E61412-107C, and E61412-107K, were prepared and shown in Table 1.

Table 1 had shown compositions with and without additives. All compositions contained citric acid, triammonium citrate, TTL, $H_2O_2$, EDTA, TEAH and DI water.

Composition E21334-136I comprising no additives was used as a comparative composition. The etch selectivity for PVD TiN vs. CVD TiN provided by the composition was <1 for the composition. In Table 1, the peroxide is a 30% peroxide solution.

TABLE 1

PVD/CVD TiN Etch Selectivity

| Grams needed | RM assay, wt % | E21334-136I | E61412-106Q | E61412-106R | E61412-107C | E61412-107K |
|---|---|---|---|---|---|---|
| citric acid | 100% | 0.5 | 0 | 0 | 0 | 0 |
| triammonium citrate | 100% | 1.2 | 2.5 | 2.5 | 2.5 | 2.5 |
| DIW | 100% | 58 | 57.1 | 56.6 | 57.4 | 48.9 |
| (methyl-1H-benzotriazole) TTL | 100% | 0.3 | 0.3 | 0.3 | 0.3 | 0.3 |
| H2O2 | 30% | 30 | 30 | 30 | 30 | 30 |
| EDTA | 100% | 0.6 | 0.6 | 0.6 | 0.6 | 0.6 |
| TEAH | 35% | 9.4 | 9 | 9 | 9 | 9 |
| PEI 10000 MW | 1% | | 0.5 | 1 | 0 | 0 |
| octylamine | 100% | | | | 0.2 | 0.2 |
| sulfolane | 100% | | | | | 8.5 |
| PVD TiN E/R (Å/min) @ 45 C. | | 118 | | | 90 | 147 |
| CVD TiN E/R (Å/min) @ 45 C. | | 152 | | | 26 | 62 |
| PVD/CVD TiN Etch Selectivity | | 0.8 | | | 3.5 | 2.4 |
| PVD TiN E/R (Å/min) @ 50 C. | | | 95 | 65 | 200 | |
| CVD TiN E/R (Å/min) @ 50 C. | | | 37 | 13 | 93 | |
| PVD/CVD TiN Etch Selectivity | | | 2.6 | 5.0 | 2.2 | |

When additives such as polyethyleneimine (PEI) and/or octylamine were added to the composition, etch rates for both TiN materials were reduced. However, the etch rates for CVD TiN were reduced much more rapidly than the etch rates for PVD TiN, resulting in a large increase in PVD TiN/CVD TIN etch selectivity to >2 and >3, while still maintaining high PVD TiN etch rates for hard mask removal.

Example 3: Co Compatibility

Compositions E61412-106U, and E61412-106U2 were prepared and shown in Table 2. Both compositions contained same amount of ammonium hydroxide, triammonium citrate, TTL, $H_2O_2$, EDTA, TEAH, PEI with 10000MW, and DI water. The only difference between the two was the use of 0.1 wt % decanoic acid in E61412-106U2. Data in Table 2 was shown as grams needed.

The data in Table 2 had shown that while composition E61412-106U offered high PVD TiN etch rate and >2 PVD TiN/CVD TiN etch selectivity, the composition also had high etch rate for Co. With 0.1 wt % of decanoic acid, E61412-106U2 had successfully reduced the Co etch rate significantly from 169 Å/min to 3 Å/min. The addition of low levels of decanoic acid, i.e., a long chain organic acid, had restored the Co compatibility of the compositions. In Table 2, the peroxide is a 30% peroxide solution.

TABLE 2

Co Compatibility

| | E61214-106U | E61214-106U2 |
|---|---|---|
| Grams needed | | |
| ammonium hydroxide | 1 | 1 |
| triammonium citrate | 2.5 | 2.5 |
| DIW | 56.1 | 56.1 |
| (methyl-1H-benzotriazole) TTL | 0.3 | 0.3 |
| H2O2 | 30 | 30 |
| EDTA | 0.6 | 0.6 |
| TEAH | 9 | 9 |
| PEI 10000 MW | 1 | 1 |
| decanoic acid | | 0.1 |

TABLE 2-continued

Co Compatibility

| | E61214-106U | E61214-106U2 |
|---|---|---|
| PVD TiN Etch Rate (Å/min) | 126 | 169 |
| CVD TiN Etch Rate (Å/min) | 296 | 169 |
| Co Etch Rate (Å/min) | 344 | 3 |

The data in Table 2 indicated that under certain conditions, such as high ammonium ion concentration, the Co compatibility of the compositions of present invention can deteriorate significantly. Thus, the addition of low levels of a long chain organic acid, e.g., decanoic acid can restore the Co compatibility of the compositions.

Example 4: Tunable TiN Etch Rate With Co Compatibility

Compositions E21334-193I, E21334-193K, E21334-193L, E21334-193M, E21334-193N were prepared and shown in Table 3. Data in Table 3 was shown as grams needed.

All compositions contained same amount of citric acid, triammonium citrate(TAC), TTL, $H_2O_2$, EDTA, TEAH, and DMSO. However, 0.2 grams of DIW in formulation 193I was replaced in 193K, 193L, 193M and 193N with the same amount of different long chain organic amines: alkylamine of 1-Hexylamine, 1-Octylamine, n-Decylamine or 1-Dodecylamine, respectively.

The data in Table 3 had shown that while compositions E21334-193I, E21334-193K, and E21334-193L offered high PVD TiN etch rates; E21334-193M and E21334-193N offered relatively low PVD TiN etch rates. That is, the tunable TiN etch rate was achieved by using different long chain organic amines.

TABLE 3

| | E21334-193 | E21334-193I | E21334-193K | E21334-193L | E21334-193M | E21334-193N |
|---|---|---|---|---|---|---|
| citric acid | 0.3 | 0.3 | 0.3 | 0.3 | 0.3 | 0.3 |
| TAC | 0.3 | 0.3 | 0.3 | 0.3 | 0.3 | 0.3 |
| DIW | 7.3 | 7.3 | 7.1 | 7.1 | 7.1 | 7.1 |
| TTL | 2.5 | 2.5 | 2.5 | 2.5 | 2.5 | 2.5 |
| H2O2 (30%) | 50 | 50 | 50 | 50 | 50 | 50 |
| EDTA | 0.6 | 0.6 | 0.6 | 0.6 | 0.6 | 0.6 |
| TEAH | 9 | 9 | 9 | 9 | 9 | 9 |
| DMSO | | 30 | 30 | 30 | 30 | 30 |
| 1-Hexylamine | | | 0.2 | | | |
| 1-Octylamine | | | | 0.2 | | |
| n-Decylamine | | | | | 0.2 | |
| 1-Dodecylamine | | | | | | 0.2 |
| PVD TiN e/r @ 55 C. | | 194.67 | 157.6 | 96 | 9.33 | 8 |
| Co e/r @55 C. | | 1 | 0.63 | 0.67 | 0.6 | 0.77 |

In some applications it is not desirable to completely remove the TiN hardmask, only partially remove or "pull back" the TiN hardmask using peroxide chemistry. In these cases, a peroxide chemistry with low TiN etch rate is needed.

The etch rates results showed that E21334-193M and E21334-193N were good for TiN hard mask "pull back" applications. The results for 193M and 193N showed that some long chain alkylamine surfactants can be used to passivate TiN and is a corrosion inhibitor for PVD TiN.

The results indicated that long chain organic amines used in the compositions in the present invention provided tunable etch rates for either TiN hard mask removal or "pull back" applications.

Example 5: Composition Preparation

Compositions e21334-111 and e21334-111S shown in Table 5 were prepared according to the following steps.

TABLE 5

| | e21334-111 | e21334-111S |
|---|---|---|
| TEAH (35%) | 6.06 | 6.5 |
| citric acid | 0.5 | 0.5 |
| triammonium citrate | 0.61 | 0.6 |
| DIW | 82.69 | 82.1 |
| (methyl-1H-benzotriazole) | 0.15 | 0.3 |
| $H_2O_2$(30%) | 9.99 | 10 |
| Total | 100.00 | 100.00 |

The specific amount of citric acid and triammonium citrate were weighed and dissolved by DI water in a beaker to obtain a citric buffer solution. TEAH (35%) was added in the citric buffer solution slowly. Methyl-1H-benzotriazole was then added in the solution, the solution was stirred to dissolve methyl-1H-benzotriazole. $H_2O_2$ was added in the solution. The solution was mixed homogeneously. All steps were performed at room temperature.

The etch rates were (A/min) measured at room temperature to 55° C., the time frame for TiN etch rate was 5 mins and 30 mins for Cu. The Cu, TiN Co and W etch rates were measured using a ResMap 4 point probe resistivity meter. TEOS, SiN, low K film were measured by ellipsometry. The etch rates were calculated by the thickness difference before and after treatment divided by immersion time.

Example 6: Performance of the Compositions of Example 5 (Etch Rate Measurement

TiN remove capability and clean performance of composition e21334-111S were shown in Table 6.

TABLE 6

Etch Rate of e21334-111S at 35° C.

| Blanket film | Cu | TiN | Co | TEOS |
|---|---|---|---|---|
| Etch rate (A/min) | <1 | 32.0 | 3.2 | <1 |

Note:
All the etch rates were measured at 35° C.

Chemistry compatibility with patterned low k materials was shown in FIG. 1. The data shows that the compositions of present invention increased the TiN to Cu selectivity (the etch rate ratio: Etch rate of TiN:Etch rate of Cu) to >30:1. The compositions were also compatible with patterned low k materials.

Example 7: Composition Stability at 60° C.

Figure 2A:
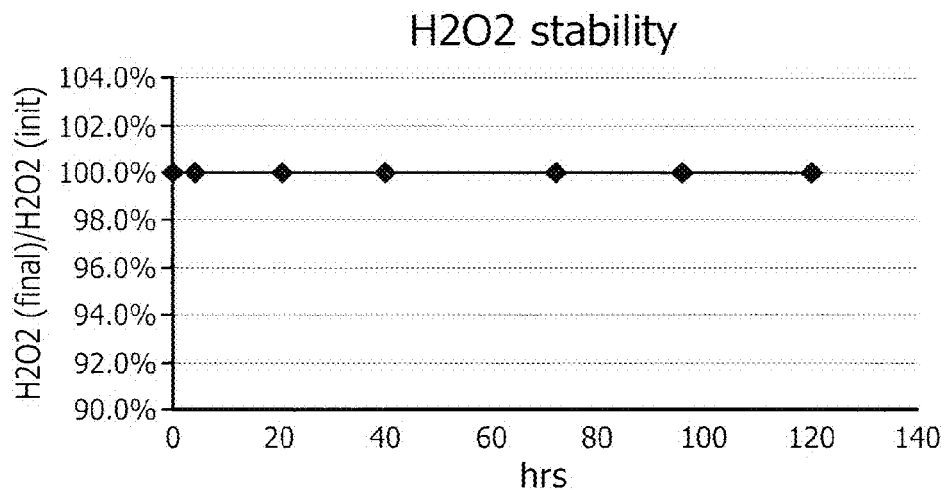
FIG. 2(a) is a graph illustrating the stability of a composition of the present invention comprising corrosion inhibitor VS $H_2O_2$.
Figure 2B:
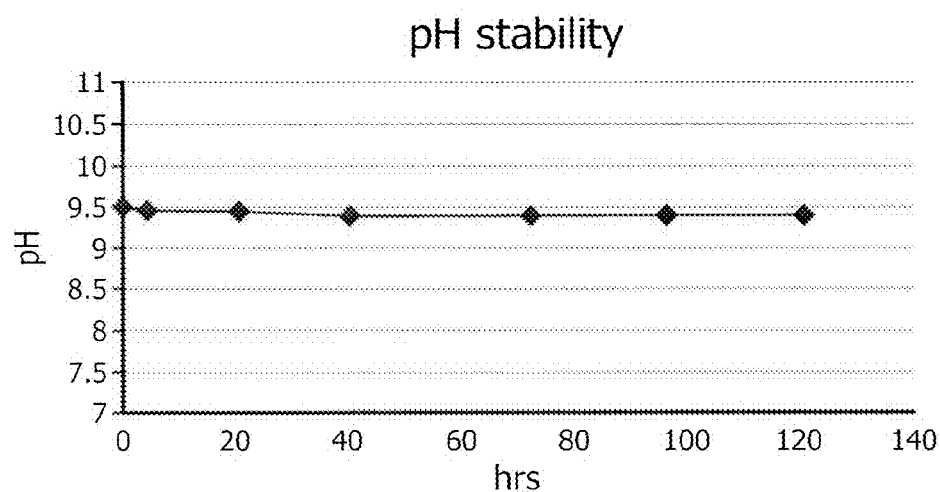
FIG. 2(b) is a graph illustrating the pH stability of the composition of FIG. 2(a)

FIG. 2 shows the plots of hydrogen peroxide concentration and pH with time at 60° C. The plots indicated the stability of e21334-111S composition.

The data demonstrates that the as prepared composition was stable with respect to peroxide and component breakdown.

Example 8: Use of Copper Corrosion Inhibitors

Comparative compositions with and without the use of Cu corrosion inhibitor were shown in Table 7. The difference between composition e21334-106R and e21334-106S was that e21334-106S had thioglycerol. The difference between composition e21334-107A and e21334-107X was that e21334-107X had methyl-1H-benzotriazole (TTL).

The data in Table 7 demonstrates that adding Cu corrosion inhibitors in the compositions of present invention could suppress copper etching. In the absence of an inhibitor, the copper etch rate was quite high due to the oxidizing properties of the composition. Adding thioglycerol or/and methyl-1H-benzotriazole (TTL) to the compositions significantly reduced Cu etch rate at 60° C.

TABLE 7

Cu Etch Rate at 60° C.

| | e21334-106R | e21334-106S | | e21334-107A | e21334-107X |
|---|---|---|---|---|---|
| TEAH (35%) | 8.45 | 8.45 | TEAH (35%) | 4.23 | 4.23 |
| citric acid | 1.00 | 1.00 | citric acid | 0.5 | 0.5 |
| triammonium citrate | 1.22 | 1.22 | triammonium citrate | 0.61 | 0.61 |
| DIW | 89.33 | 87.33 | DIW | 94.66 | 94.51 |
| 1-Thioglycerol | 0.00 | 2.00 | (methyl-1H-benzotriazole) TTL | 0 | 0.15 |
| Total | 100.00 | 100.00 | Total | 100.00 | 100.00 |
| pH (neat) | 9.32 | 8.47 | pH (neat) | 9.3 | 8.9 |
| Cu etch rate (A/min) 60° C./5 mins | 81.2 | 1.99 | Cu etch rate (A/min) 60° C./5 mins | 123.34 | 0.2 |

70 mL of each of these formulations were blended with 30 mL of 30% $H_2O_2$ to make the final formulation for corrosion inhibitor tests.

Example 9: The Impact of pH on TiN and Cu Etch Rate

The data in Tables 8(a-c) have shown the impact of changing the pH from 7-10.4 in the compositions on the TiN and Cu etch rates. The compositions in Tables 8(a-c) were also having different concentrations of $H_2O_2$.

TABLE 8a

At $H_2O_2$ = 1 wt %

| | e21334-109B | e21334-109M | e21334-107Y | e21334-109C | e21334-109D |
|---|---|---|---|---|---|
| TEAH (20%) | 5.6 | 6.25 | 7.4 | 9.45 | 13.65 |
| citric acid | 0.5 | 0.5 | 0.5 | 0.5 | 0.5 |
| triammonium citrate | 0.61 | 0.61 | 0.61 | 0.61 | 0.61 |
| DIW | 89.81 | 89.16 | 88.01 | 85.96 | 81.76 |
| (methyl-1H-benzotriazole) TTL | 0.15 | 0.15 | 0.15 | 0.15 | 0.15 |
| H2O2 (30%) | 3.33 | 3.33 | 3.33 | 3.33 | 3.33 |
| Total | 100.00 | 100.00 | 100.00 | 100.00 | 100.00 |
| pH (neat) | 7.0 | 8.1 | 8.7 | 9.5 | 10.4 |
| Cu etch rate (A/min) 60 C./5 mins | 0.9 | 0.70 | 1.2 | 1.7 | 40.2 |
| TiN etch rate (A/min) 60 C./5 mins | 3.7 | 43.5 | 89.0 | 100.1 | 144.1 |
| Clean performance | NG | NG | OK | OK | Cu damage |

TABLE 8b

At $H_2O_2$ = 2 wt %

| | e21334-109I | e21334-109N | e21334-109J | e21334-109K | e21334-109L |
|---|---|---|---|---|---|
| TEAH (20%) | 5.6 | 6.25 | 7.4 | 10.03 | 15.48 |
| citric acid | 0.5 | 0.5 | 0.5 | 0.5 | 05 |
| triammonium citrate | 0.61 | 0.61 | 0.61 | 0.61 | 0.61 |
| DIW | 86.48 | 85.83 | 84.68 | 82.06 | 76.61 |
| (methyl-1H-benzotriazole) TTL | 0.15 | 0.15 | 0.15 | 0.15 | 0.15 |
| H2O2 (30%) | 6.66 | 6.66 | 6.66 | 6.66 | 6.66 |
| Total | 100.00 | 100.00 | 100.00 | 100.00 | 100.00 |
| pH (neat) | 6.91 | 7.78 | 8.76 | 9.5 | 10.38 |
| Cu etch rate (A/min) 60 C./5 mins | 0.324 | 0.70 | 0.71 | 4.288 | 48.9 |
| TiN etch rate (A/min) 60 C./5 mins | 42.23 | 72.11 | 169.94 | 207.8 | 188.56 |
| Clean performance | NG | OK | OK | OK | Cu damage |

TABLE 8c

At H$_2$O$_2$ = 3 wt %

| | e21334-109E | e21334-109O | e21334-109F | e21334-109G | e21334-109H |
|---|---|---|---|---|---|
| TEAH (20%) | 5.6 | 6.25 | 7.4 | 10.6 | 17.3 |
| citric acid | 0.5 | 0.5 | 0.5 | 0.5 | 0.5 |
| triammonium citrate | 0.61 | 0.61 | 0.61 | 0.61 | 0.61 |
| DIW | 83.15 | 82.50 | 81.35 | 78.15 | 71.45 |
| (methyl-1H-benzotriazole) TTL | 0.15 | 0.15 | 0.15 | 0.15 | 0.15 |
| H2O2 (30%) | 9.99 | 9.99 | 9.99 | 9.99 | 9.99 |
| Total | 100.00 | 100.00 | 100.00 | 100.00 | 100.00 |
| pH (neat) | 6.9 | 7.9 | 8.7 | 9.5 | 10.3 |
| Cu etch rate (A/min) 60 C./5 mins | 0.7 | 0.51 | 1.1 | 12.7 | 19.3 |
| TiN etch rate (A/min) 60 C./5 mins | 73.6 | 163.79 | 200.0 | 250.0 | 333.0 |
| Clean performance | NG | OK | OK | Cu damage | Cu damage |

The data demonstrates that both TiN and Cu etch rates were increased with increasing pH and H$_2$O$_2$ concentration. A pH lower than 9.0 was required to achieve copper etch rates of lower than 1 A/min at 60° C. even with the present of corrosion inhibitors.

Residue removal capability was also greatly affected at pH lower than 8 and at lower H$_2$O$_2$ concentrations.

Example 10: Use of Triammonium Citrate as a Buffer

Compositions both with and without triammonium citrate as a buffer were shown in Table 9.

Figure 3:
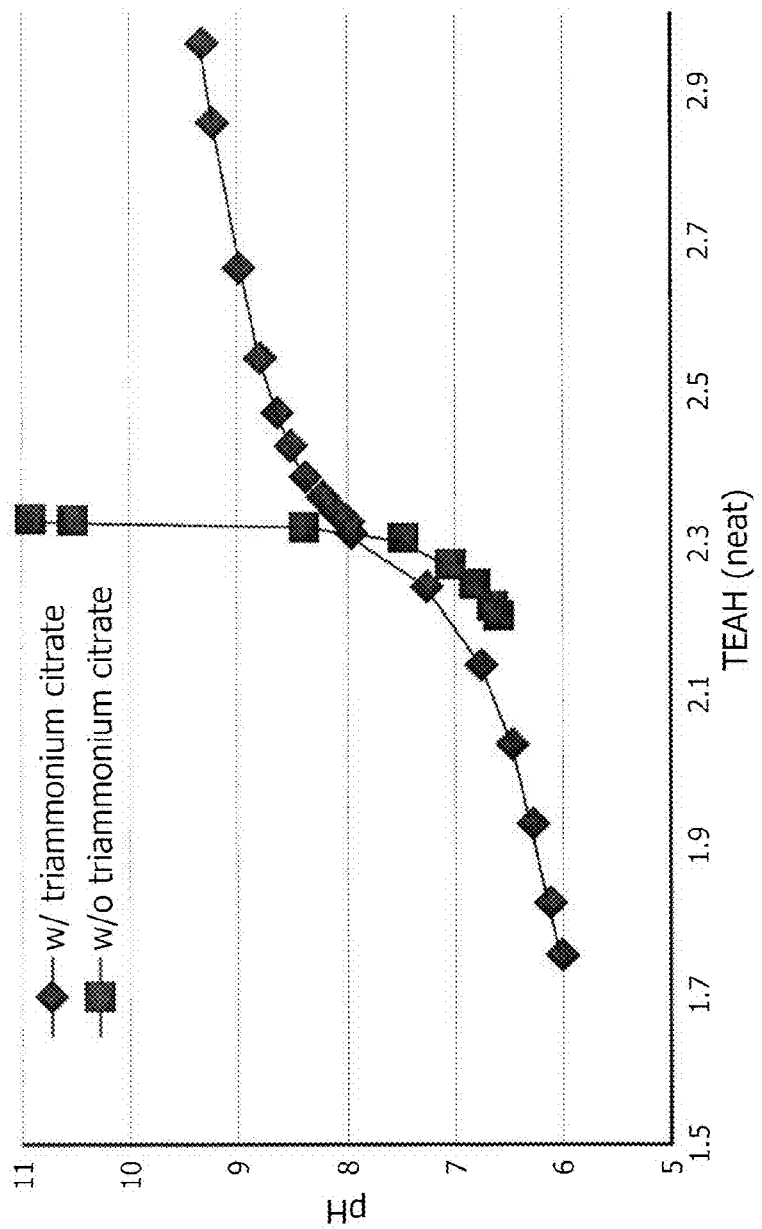
FIG. 3. is a graph illustrating the pH stabilizing effect of a buffer system.

FIG. 3 illustrates that compositions with triammonium citrate were readily maintained near the targeted pH range even with varying base concentrations.

TABLE 9

| | e21334-106P | e21334-106M |
|---|---|---|
| TEAH (35%) | 6.65 | 6.65 |
| citric acid | 1.00 | 1.00 |
| triammonium citrate | 1.22 | 0 |
| DIW | 91.13 | 92.35 |
| Total | 100.00 | 100.00 |

Example 11: Improving Bath Life

When e21334-111S composition was exposed to metallic impurities, such as trace levels of copper ions arising even from the slow (<1 A min) etching of copper by these compositions, hydrogen peroxide in the composition rapidly decomposed to oxygen gas and water. The degradation of peroxide will damage the clean performance and TiN etch rate.

Figure 4:
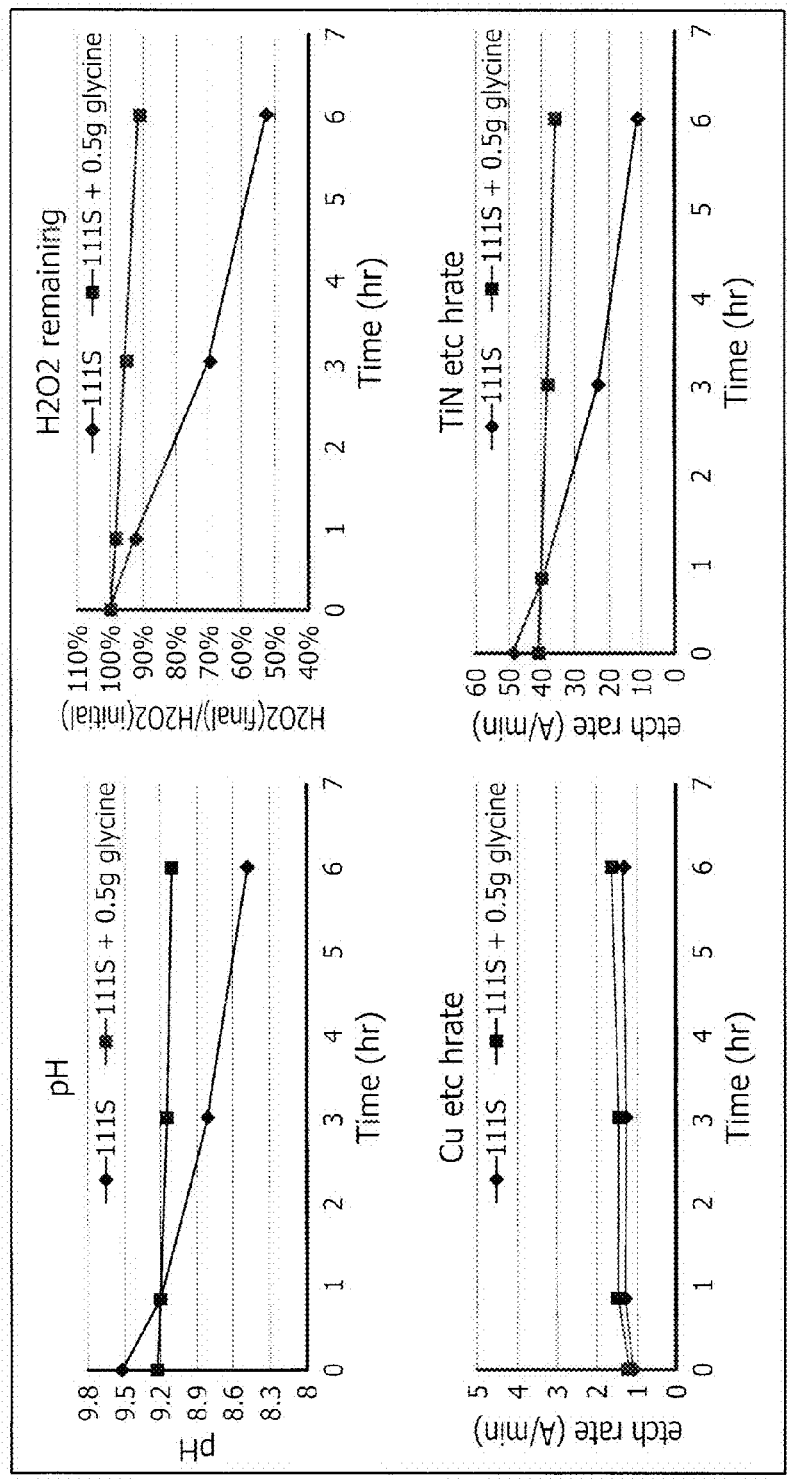
FIG. 4. is a series of graphs illustrating the stability of compositions of the present invention with and without a chelating agent.

The data in FIG. 4 shows that the incorporation of glycine in e21334-111S as a chelating agent effectively stabilized peroxide and prolonged the bath-life of e21334-111S (at 45° C.).

Due to the high stability of the resulting peroxide composition, the pre-mixing approach for the addition of peroxide rather than in-situ mixing can be realized thus low the capital cost of the composition.

Example 12: Benzotriazole-Free Composition

Benzotriazole (BAT) and its derivatives can be used as Cu corrosion inhibitors. Those corrosion inhibitors can form a tenacious film of Cu-BAT which protects the metal from further corrosion. However, the tenacious film of Cu-BAT potentially results in higher resistance during electrical test measurements.

A benzotriazole free composition, e21334-135S, was developed and described in Table 10.

TABLE 10

| | e21334-135S |
|---|---|
| Citric acid | 0.70 |
| Triamm citrate (20%) | 0.20 |
| DIW | 49.8 |
| TMPAH 40% | 9.1 |
| EDTA | 0.20 |
| H2O2 (30%) | 40.00 |
| Total | 100.00 |
| pH | 9.08 |
| Etch rate (A/min) of Cu @ 35° C. | 1.22 |
| Etch rate (A/min) of TiN @35° C. | 148 |

Figure 5A:
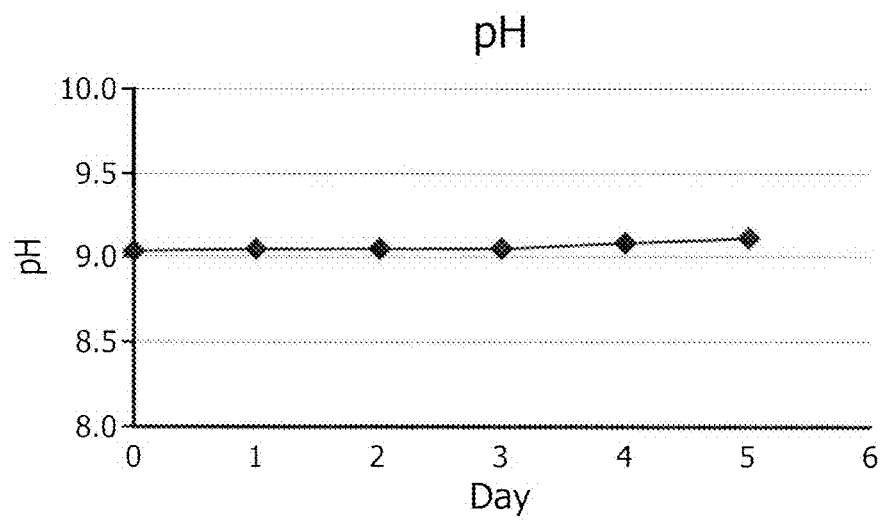
FIG. 5(a) is a graph illustrating the pH stability of a composition with non-corrosion inhibitor type chemical additive VS $H_2O_2$.
Figure 5B:
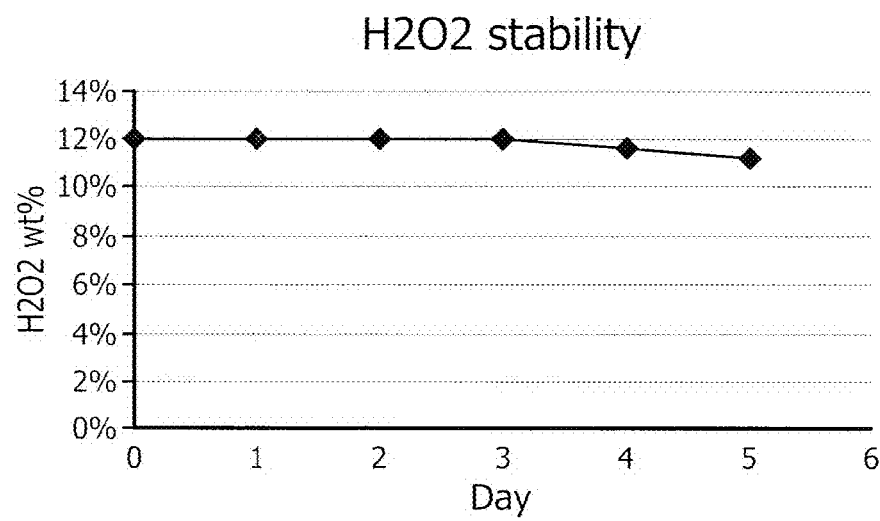
FIG. 5(b) is a graph illustrating the hydrogen peroxide stability of a composition with non-corrosion inhibitor type chemical additive VS $H_2O_2$.

The stability of e21334-135S composition is shown in FIG. 5.

Figure 6A:
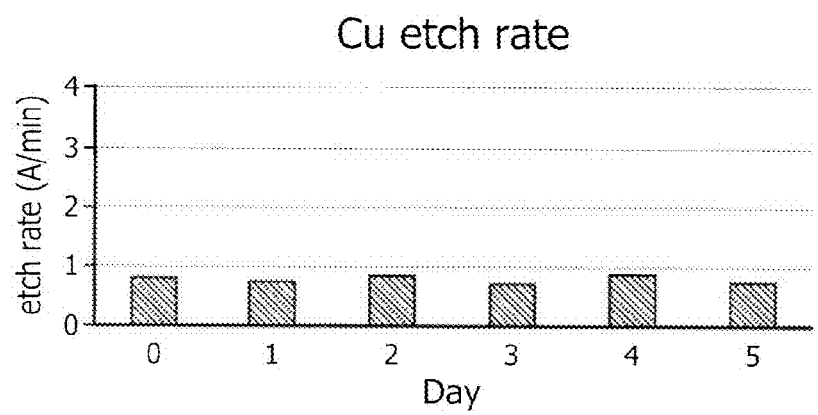
FIG. 6(a) is a graph illustrating the etch rate for Cu using a composition with a non-corrosion inhibitor type chemical additive.
Figure 6B:
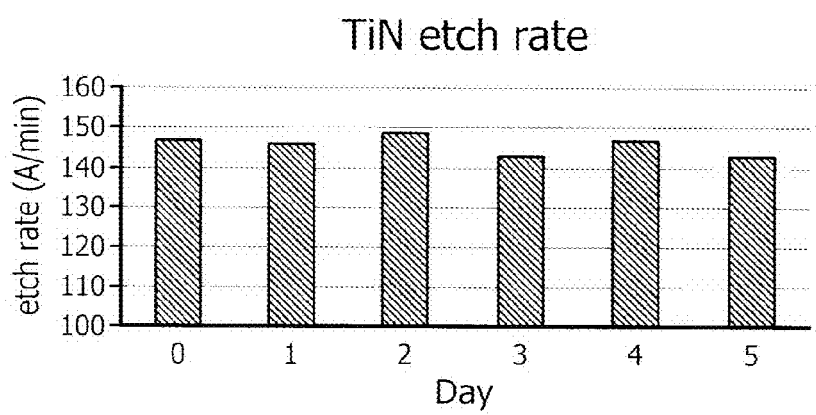
FIG. 6(b) is a graph illustrating the etch rate for TiN using a composition with a non-corrosion inhibitor type chemical additive.

Etching data as function of time (day) using e21334-135S composition for Cu and TiN is illustrated in FIG. 6.

TiN etch rates using e21334-135S composition provided comparable etch rates and residue removal capability without the use of benzotriazole (BAT) and its derivatives.

The data also indicated that trimethylphenylammonium hydroxide(TMPAH) was effective in minimizing copper etch rate in the compositions.

Example 13: Compositions for Drain Mode Operation

In one embodiment of present invention, the compositions may be used in drain mode, that is, the chemistry is dispensed on a wafer in a single wafer tool and is then disposed. This mode of operation allows the use of much more dilute concentrations of chelating agent than in a recycle mode operation.

Compositions for drain mode were developed and shown in Table 11.

TABLE 11

|  | 143G | 143H | 143I | 143J | 144B |
|---|---|---|---|---|---|
| citric acid | 0.064 | 0.064 | 0.064 | 0.064 | 0.064 |
| triammonium citrate | 0.8 | 0.8 | 0.8 | 0.8 | 0.080 |
| DIW | 66.42 | 66.92 | 67.50 | 67.92 | 67.63 |
| (methyl-1H-benzotriazole) TTL | 0.05 | 0.05 | 0.05 | 0.05 | 0.007 |
| H2O2 (30%) | 30 | 30 | 30 | 30 | 30.000 |
| EDTA | 0.018 | 0.018 | 0.018 | 0.018 | 0.022 |
| TEAH | 2.70 | 2.20 | 1.60 | 1.20 | 2.20 |
|  | 100.1 | 100.1 | 100.1 | 100.1 | 100.0 |
| pH | 9.12 | 8.97 | 8.80 | 8.60 | 8.96 |
| Cu Etch Rate (A/min) at 40° C. | 1.24 | 0.76 | 1.56 | 1.18 |  |
| TiN Etch Rate (A/min) at 40° C. | 137 | 104 | 86 | 88 |  |

Compositions for recycle-mode were developed and shown in Table 12.

TABLE 12

|  | e21334-136D | e21334-136H | e21334-136I | e21334-136J |
|---|---|---|---|---|
| citric acid | 0.5 | 0.5 | 0.5 | 0.5 |
| triammonium citrate | 0.6 | 0.9 | 1.2 | 1.5 |
| DIW | 58.6 | 58.3 | 58 | 57.7 |
| (methyl-1H-benzotriazole) TTL | 0.3 | 0.3 | 0.3 | 0.3 |
| H2O2 (30%) | 30 | 30 | 30 | 30 |
| EDTA | 0.6 | 0.6 | 0.6 | 0.6 |
| TEAH (35%) | 9.4 | 9.4 | 9.4 | 9.4 |
| pH | 9 | 8.87 | 8.85 | 8.82 |
| Cu E/R (A/min) @ 40 C. | 1.53 | 1.38 | 1.16 | 1.33 |
| TiN E/R (A/min) @ 40 C. | 234.83 | 334 | 363.67 | 337.83 |

Example 15: TiN Etch Rate Enhancement with Different Ammonium Cations

Compositions containing a variety of ammonium salt buffers were developed and shown in Table 13. The etch rate (A/min) performance of the compositions was also shown in Table 13. The data indicated that the presence of ammonium cations in the composition is important for achieving high TiN etch rates and good TiN hard mask removal. In Table 13, the peroside is a 30% solution in water.

TABLE 13

|  | 146A | 146B | 146C | 146D | 146E | 146G | 146H | 146I |
|---|---|---|---|---|---|---|---|---|
| citric acid | 0.064 | 0.064 | 0.064 | 0.064 | 0.064 | 0.064 | 0.064 | 0.064 |
| DIW | 67.707 | 67.627 | 67.631 | 67.638 | 67.592 | 67.616 | 67.247 | 67.651 |
| (methyl-1H-benzotriazole) TTL | 0.007 | 0.007 | 0.007 | 0.007 | 0.007 | 0.007 | 0.007 | 0.007 |
| EDTA | 0.022 | 0.022 | 0.022 | 0.022 | 0.022 | 0.022 | 0.022 | 0.022 |
| H2O2 | 30.000 | 30.000 | 30.000 | 30.000 | 30.000 | 30.000 | 30.000 | 30.000 |
| TEAH (35%) | 2.200 | 2.200 | 2.200 | 2.200 | 2.200 | 2.200 | 2.200 | 2.200 |
| triammonium citrate | 0.000 | 0.080 |  |  |  |  |  |  |
| Ammonium acetate |  |  | 0.076 |  |  |  |  |  |
| Ammonium Sulfate |  |  |  | 0.069 |  |  |  |  |
| Ammonium Persulfate |  |  |  |  | 0.115 |  |  |  |
| NH4F 40% |  |  |  |  |  | 0.091 |  |  |
| TMAF 20% |  |  |  |  |  |  | 0.460 |  |
| NH4HF2 |  |  |  |  |  |  |  | 0.056 |
| pH | 9.04 | 9 | 8.98 | 8.98 | 8.93 | 8.97 | 9.02 | 8.84 |
| TiN E/R at 40 C. | 15.91 | 101.78 | 114.69 | 106.19 | 112.11 | 128.85 | 16.52 | 99.19 |

Example 14: Compositions for Recycle Mode Operation

In another embodiment of this invention, the compositions may be used in a recycle-mode, in which the chemistry is dispensed on the wafer and then returns to a storage tank under re-circulation. The chemistry can effectively be re-used for the cleaning of many wafers in this mode.

Example 16: ECP Clean to Replace Triammonium Citrate

Compositions contained ECP Clean, other than triammonium citrate (TAC) were prepared and shown in Tables 14 and 15.

ECP Clean is a commercial mixture of water, citric acid and ammonium hydroxide solution from Air Products®.

TABLE 14

|  | 176I | 176J | 176B | 176C | 176D | 176H | 176E |
|---|---|---|---|---|---|---|---|
| DIW | 67.671 | 67.571 | 67.42 | 67.32 | 67.22 | 67.141 | 67.07 |
| H2O2 (30%) | 30.000 | 30.000 | 30.00 | 30.00 | 30.00 | 30.000 | 30.00 |
| TEAH | 2.200 | 2.200 | 2.2000 | 2.2000 | 2.2000 | 2.200 | 2.2000 |
| EDTA | 0.022 | 0.022 | 0.0220 | 0.0220 | 0.0220 | 0.022 | 0.0220 |

TABLE 14-continued

|  | 176I | 176J | 176B | 176C | 176D | 176H | 176E |
|---|---|---|---|---|---|---|---|
| TTL | 0.007 | 0.007 | 0.0070 | 0.0070 | 0.0070 | 0.007 | 0.0070 |
| ECP clean | 0.10 | 0.20 | 0.35 | 0.45 | 0.55 | 0.63 | 0.70 |
| pH | 9.10 | 9.10 | 9.00 | 9.00 | 8.91 | 8.91 | 8.89 |
| Cu e/r (Å/min) 35 C. | 0.62 | 0.62 | 0.93 | 1.29 | 1.38 | 1.69 | 1.62 |
| TiN e/r (Å/min) 35 C. | 39.93 | 59.40 | 80.47 | 83.53 | 91.73 | 96.55 | 105.50 |

The data in Tables 14 and 15 have shown that the compositions with ECP Clean provided comparable performance in both drain mode and recycle-mode operations.

TABLE 15

|  | e21334-177A | e21334-177B | e21334-177C | e21334-177D | e21334-177E |
|---|---|---|---|---|---|
| EDTA | 0.6 | 0.6 | 0.6 | 0.6 | 0.6 |
| TEAH (35%) | 9.4 | 9.4 | 9.4 | 9.4 | 9.4 |
| DIW | 56 | 56.3 | 56.6 | 56.9 | 57.3 |
| H2O2 (30%) | 30 | 30 | 30 | 30 | 30 |
| TTL | 0.5 | 0.5 | 0.5 | 0.5 | 0.5 |
| ECP Clean | 3.5 | 3.2 | 2.9 | 2.6 | 2.2 |
| pH | 8.93 | 8.97 | 9.04 | 9.12 | 9.22 |
| Cu E/R (A/min) @50 C. | 1.53 | 1.37 | 1.22 | 1.79 | 1.96 |
| TiN E/R (A/min) @50 C. | 113.05 | 117.06 | 138.4 | 131.2 | 121.3 |

Example 17: Semi-Aqueous (with Organic Solvent) Compositions

Compositions containing the organic solvents sulfolane and dipropyleneglycol methyl ether were prepared and shown in Table 16.

The etch performance of compositions from the data in Table 16 shows that the compositions containing the organic solvents improved the TiN etch rate.

TABLE 16

|  | 186O | 186P | 186Q | 186U | 186V |
|---|---|---|---|---|---|
| citric acid | 0.5 | 0.5 | 0.5 | 0.5 | 0.5 |
| TAC | 1.2 | 1.2 | 1.2 | 1.2 | 1.2 |
| DIW | 36.7 | 26.7 | 16.7 | 26.7 | 16.7 |
| TTL | 1 | 1 | 1 | 1 | 1 |
| H2O2 (30%) | 50 | 50 | 50 | 50 | 50 |
| EDTA | 0.6 | 0.6 | 0.6 | 0.6 | 0.6 |
| TEAH | 10 | 10 | 10 | 10 | 10 |
| DPM | 0 | 10 | 20 |  |  |
| sulfolane |  |  |  | 10 | 20 |
| pH of formulation | 8.34 | 8.45 | 8.43 | 8.31 | 8.33 |
| TiN E/R (A/min) @50° C. | 163.18 | 169.24 | 187.73 | 180.6 | 191.45 |
| Cu E/R (A/min) @50° C. | 1.06 | 1.56 | 3.23 | 1.98 | 2.44 |

The foregoing examples and description of the preferred embodiments should be taken as illustrating, rather than as limiting the present invention as defined by the claims. As will be readily appreciated, numerous variations and combinations of the features set forth above can be utilized without departing from the present invention as set forth in the claims. Such variations are not regarded as a departure from the spirit and scope of the invention, and all such variations are intended to be included within the scope of the following claims.

The invention claimed is:

1. A composition for selectively removing PVD titanium nitride (TiN or TiNxOy; where x=0 to 1.3 and y=0 to 2) from a semiconductor device comprising the PVD titanium nitride and a second material selected from the group consisting of Cu, Co, CVD titanium nitride, dielectric material, low-k dielectric material, and combinations thereof, the composition comprising:

1 to 20 wt % peroxide,
1-5 wt % base,
0.1-1 wt % weak acid,
0.5 to 2 wt % ammonium salt,
25 to 5000 ppm corrosion inhibitor or 1-15 wt % of a long chain or mixed alkyammonium hydroxide,
10 to 5000 ppm, long chain organic amine or polyalkylamine,
and
solvent,
wherein
the ammonium salt is selected from the group consisting of ammonium citrate, ammonium acetate, ammonium malonate, ammonium adipate, ammonium lactate, ammonium iminodiacetate, ammonium chloride, ammonium bromide, ammonium fluoride, ammonium bifluoride, ammonium sulfate, and combinations thereof; and
the composition has a pH ranging from 7 to 11.5.

2. The composition of claim 1, wherein the peroxide is selected from the group consisting of hydrogen peroxide, ammonium persulfate, peracidic acid, peroxybenzoic acid, and combinations thereof.

3. The composition of claim 2, wherein the peroxide is hydrogen peroxide.

4. The composition of claim 1, wherein the base is selected from the group consisting of tetraethylammonium hydroxide(TEAH), trimethylphenylammonium hydroxide, tetramethylammonium hydroxide, tetrabutylammonium hydroxide, choline hydroxide, ammonium hydroxide, and combinations thereof.

5. The composition of claim 4, wherein the base is tetraethylammonium hydroxide.

6. The composition of claim 1, wherein the weak acid is carboxylic acid selected from the group consisting of citric acid, oxalic acid, malonic acid, lactic acid, adipic acid, acetic acid, iminodiacetic acid, and combinations thereof.

7. The composition of claim 6, wherein the weak acid is citric acid.

8. The composition of claim 1, wherein the ammonium salt is ammonium citrate.

9. The composition of claim 1, wherein the corrosion inhibitor is selected from the group consisting of 1,2,4-triazole, benzotriazole, methyl-1H-benzotriazole, 2-aminobenthothiazole, benzimidazole, 2-mercapto-5-methylbenzimidaole, 8-hydroxyquinoline, 1-thioglycerol, ascorbic acid, pyrazole, and combinations thereof.

10. The composition of claim 9, wherein the corrosion inhibitor is methyl-1H-benzotriazole.

11. The composition of claim 1, wherein the long chain or mixed alkyammonium hydroxide is selected from the group consisting of trimethylphenylammonium hydroxide (TMPAH), choline hydroxide, tetrabutylammonium hydroxide and mixed tetraalkylammonium hydroxide, wherein the alkylammonium cation contains alkyl groups of at least two different chain lengths.

12. The composition of claim 11, wherein the long chain or mixed alkyammonium hydroxide is trimethylphenylammonium hydroxide(TMPAH).

13. The composition of claim 1, wherein the long chain organic amine or polyalkylamine is selected from the group consisting of hexylamine, surfactant salts of hexylamine, octylamine, surfactant salts of octylamine, dicyclohexylamine, surfactant salts of dicyclohexylamine, polyethyleneimine, surfactant salts of polyethyleneimine, decylamine, surfactant salts of decylamine, dodecylamine, surfactant salts of dodecylamine, and combinations thereof.

14. The composition of claim 1, wherein the long chain organic amine or polyalkylamine is octylamine or polyethyleneimine.

15. The composition of claim 1, wherein the solvent is selected from the group consisting of deionized water (DI water), purified water, distilled water, dimethyl sulfoxide (DMSO), dimethyl sulfone ($DMSO_2$), sulfolane (($CH_2)_4SO_2$), n-methylpyrrolidone, dipropyleneglycolmethylether, tripropyleneglycolmethyl ether, and combinations thereof.

16. The composition of claim 15, wherein the solvent is water.

17. The composition of claim 1 further comprises from 0.01 to 1 wt % of a chelating agent selected from the group consisting of glycine, iminodiacetic acid, nitrilotriacetic acid, glutamic acid, picolinic acid, ethylenediamine tetraacetic acid(EDTA), and combinations thereof.

18. The composition of claim 1 further comprises from 100 ppm to 1000 ppm radical scavengers selected from the group consisting of manitol, polyalkylamines, (2,2,6,6-Tetramethylpiperidin-1-yl)oxyl(TEMPO), diphenylamines, and combinations thereof.

19. The composition of claim 1 further comprises from 10 to 5000 ppm of long chain organic acids or amines.

20. The composition of claim 19, wherein the long chain organic acid or amine is selected from the group consisting of decanonic acid, dodecanoic acid, dimer acid, hexylamine, surfactant salts of hexylamine, octylamine, surfactant salts of octylamine, dicyclohexylamine, surfactant salts of dicyclohexylamine, decylamine, surfactant salts of decylamine, dodecylamine, surfactant salt of dodecylamine, and combinations thereof.

21. The composition of claim 20, wherein the long chain organic acid or amine is decanonic acid.

22. The composition of claim 1, wherein the composition comprises hydrogen peroxide, tetraethylammonium hydroxide, citric acid, ammonium citrate, methyl-1H-benzotriazole or trimethylphenylammonium hydroxide (TMPAH), polyethyleneimine or octylamine, and water.

23. The composition of claim 1 wherein the peroxide is present at from about 3 wt % to about 15 wt %.

24. The composition of claim 1 wherein the pH ranges from 8 to 10.5.

25. The composition of claim 24 wherein the pH ranges from from 8.5 to 9.5.

26. The composition of claim 1 wherein the composition exhibits a removal selectivity of PVD titanium nitride vs. CVD titanium nitride >2, when the second material is CVD titanium nitride.

27. The composition of claim 1 wherein the peroxide is present from 1 to 9 wt %.

28. The composition of claim 23 wherein the peroxide is present at about 15 wt %.

29. A system for selectively removing PVD titanium nitride (TiN or $TiN_xO_y$, where x=0 to 1.3 and y=0 to 2) from a surface of a microelectronic device, comprising:
the semiconductor device comprising the PVD titanium nitride and a second material selected from Cu, Co, CVD titanium nitride dielectric material, low-k dielectric material and combinations thereof,
the composition of claim 1 for selectively removing the PVD titanium nitride, wherein the PVD titanium nitride and the second material are in direct contact with the composition the composition.

30. A process of selectively removing PVD titanium nitride (TiN or $TiN_xO_y$, where x=0 to 1.3 and y=0 to 2) comprising:
providing a semiconductor device comprising the PVD titanium nitride and a second material selected from Cu, Co, CVD titanium nitride dielectric material, low-k dielectric material;
contacting the semiconductor device with the composition of claim 1; and selectively removing the PVD titanium nitride,
wherein the PVD titanium nitride and the second material are in direct contact with the composition, and the composition offers a removal selectivity of PVD titanium nitride vs. CVD titanium nitride >2, when the second material is CVD titanium nitride.

* * * * *